United States Patent [19]

Saito

[11] Patent Number: 5,446,624
[45] Date of Patent: Aug. 29, 1995

[54] APPARATUS FOR TESTING AND PRODUCING SEMICONDUCTOR CHIPS AND INTEGRATED CIRCUITS

[75] Inventor: Kimiyoshi Saito, Yokohama, Japan

[73] Assignee: Toho Electronics, Inc., Kanagawa, Japan

[21] Appl. No.: 81,144

[22] Filed: Jun. 25, 1993

[51] Int. Cl.⁶ .............................................. H05K 1/02
[52] U.S. Cl. ................................. 361/774; 361/772; 174/261
[58] Field of Search ...................... 361/774, 773, 772; 174/260, 261

[56] References Cited

U.S. PATENT DOCUMENTS 3,649,950  3/1972  Gluntz ............................. 339/170 F
3,891,898  6/1975  Damon ............................... 317/101
4,392,181  7/1983  Jabben ............................... 361/401

Primary Examiner—Leo P. Picard
Assistant Examiner—L. Thomas
Attorney, Agent, or Firm—Fisher & Associates

[57] ABSTRACT

A probe board is provided with a guide-mask system. The probe board has at least one head which passes through a respective guide-hole located on the filmed guide-mask. The utilization of this guide-mask has the advantage of minimizing slipping of probe heads out of respective mating test terminals of IC chips. Additionally, the utilization of this guide-mask provides accurate probe head positioning and provides enforcement to the heads by way of the filmed guide-mask because of the precise support holes provided in the masks.

14 Claims, 4 Drawing Sheets

APPARATUS FOR TESTING AND PRODUCING SEMICONDUCTOR CHIPS AND INTEGRATED CIRCUITS

BACKGROUND OF THE INVENTION

1. Field of the Invention

This invention relates to improvement of probe circuit board used for tests of semiconductor devices especially during or after the production phase of large scaled integrated circuits LSIs.

2. Description of the Prior Art

With the remarkable progress in high density scales of semiconductor integrated circuits, more probes in higher densities and various probe-positioning are required to test semi-conductor devices.

A probe circuit board is generally made by fixing many probes, to a center portion of a through-holed printed-circuit board having a square shape. Molded insulating supporters are provided so that the probe heads orient downward from the probe board via ring-shaped supporting parts made of ceramic or aluminum material. FIGS. 3a and 3b illustrate cross sectional views of a conventional probe circuit boards all of which provide probes.

The cross section shown in FIG. 3a is a right half side of a conventional probe circuit board 31. In the probe circuit board 31, a probe 32 is tapered to narrow the head diameter as it approaches the head. Probe 32 is fixed to an insulator 34 by molding work to align probe 32 at approximately a 10° angle with respect to circuit board 33. Insulator 34 is fixed under a central portion of the circuit board through supporting parts 35 made of ceramic or aluminum materials which function as an insulating spacer.

Probe 32 is bent so that a head 32a is perpendicular to circuit board 33 when circuit board 33 is placed parallel to the ground.

In a probe circuit board 36 illustrated in FIG. 3b, a probe 37 is fixed perpendicular to an insulator 39 by way of molding so that probe 37 is perpendicular to circuit board 38 when circuit board 38 is placed parallel to the ground. Insulator 39 is fixed to circuit board 38 through supporting parts 40.

Semiconductor integrated circuits are tested by raising an inspection table 42 holding an IC chip 41 towards probe circuit board 31. Each head 32a of probe 32 touches each terminal 43 of the semiconductor integrated circuits to be tested.

As illustrated in FIG. 3a, at the moment in which head 32a of probe 32 touches terminal 43 of chip 41, head 32a of probe 32 tends to slide slightly on terminal 43. This is illustrated with double-chained lines in FIG. 4 which shows the movement of probe 32. With this sliding action a better contacting is expected, however, in case where terminal 43 is small, head 32a of probe 32 will slip out of terminal 43. In order to prevent this drawback, the amount of the sliding movement must be limited to a certain acceptable level.

On probe circuit board 36 providing probe 37 which has the construction illustrated in FIG. 3b, each probe 37 is arranged to be perpendicular to circuit board 36 and thereby allows for high density chip testing. When a head 37a of probe 37 makes contact with terminal 43 of chip 41, probe 37 is unable to use its own elasticity. Therefore, head 37a slips out of terminal 43 of chip 41 due to the force of contact between head 37a and terminal 43. It should be appreciated that under this condition all the probe heads 37a are not correctly aligned with respective terminals 43. Therefore, when inspection table 42, holding chip 41, is raised upward with a strong driven power towards probe board 36, probe head 37a makes contact with respective terminals 43. Unfortunately, probes 37 are forced to bend which results in neighboring heads touching each other as illustrated with the double-chained lines in FIG. 4b. Accordingly, it is required to improve these shortcomings by controlling head bending to acceptable levels.

The aim of this invention is to offer a guide-mask probe circuit board featuring that all the probe heads are always correctly arranged to the predetermined positions in order to minimize slipping movement and bending of the probe heads out of terminals of IC chips to be tested.

SUMMARY OF THE INVENTION

This invention employs a filmed guide-mask that is placed at the position where quite a number of heads of many probes are to be located, and they should pass through guide-holes arranged for the predetermined positions to match with terminals of IC chip to be tested.

With provision of the guide-holes having highly accurate positions on the guide-mask it is achieved to arrange their locations quite accurately.

The guide-mask makes a limit in slipping movement of the probe heads out of the aimed terminals of IC chip to be tested, and gives a reinforce to the head strength of probes.

BRIEF DESCRIPTION OF THE DRAWINGS

The invention will be further described in conjunction with the accompanying drawings, in which.

DETAILED DESCRIPTION OF THE PREFERRED EMBODIMENT

Figure 1A:
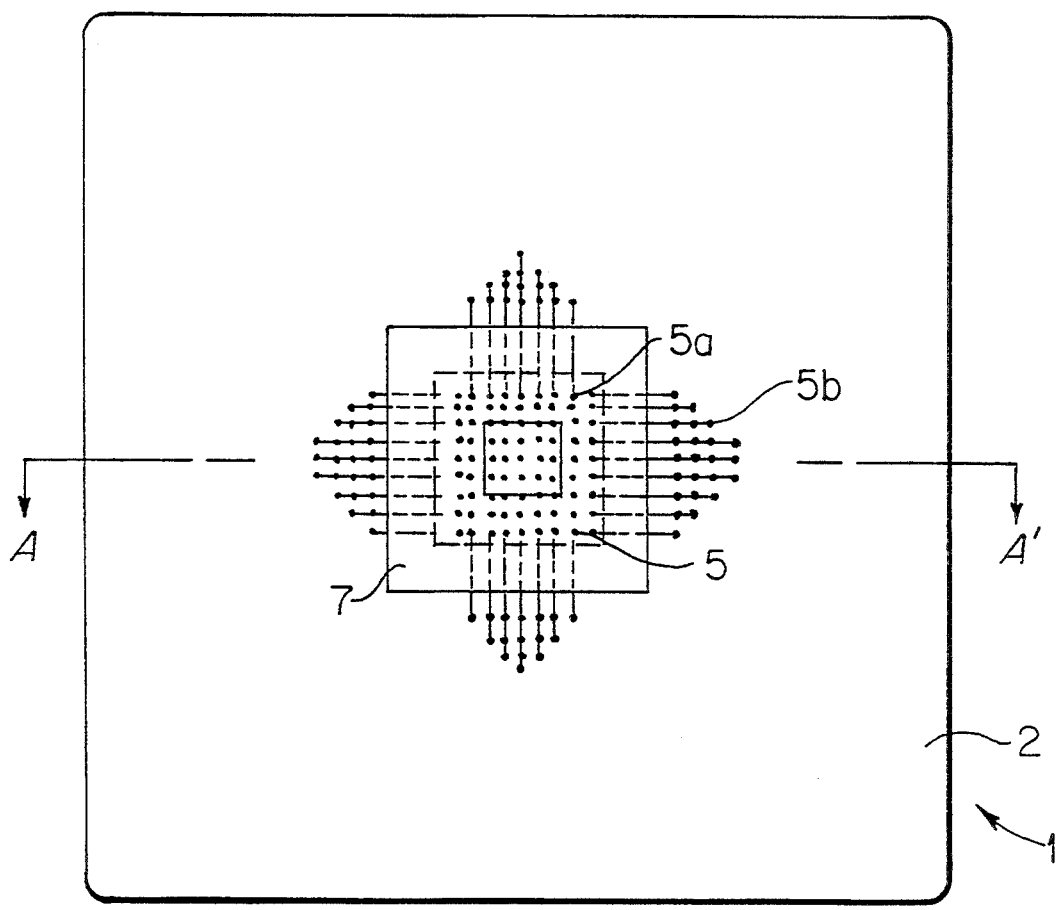
FIG. 1a is a bottom plan view of a guide-mask probe board constructed in accordance with a preferred embodiment of the invention.
Figure 1B:
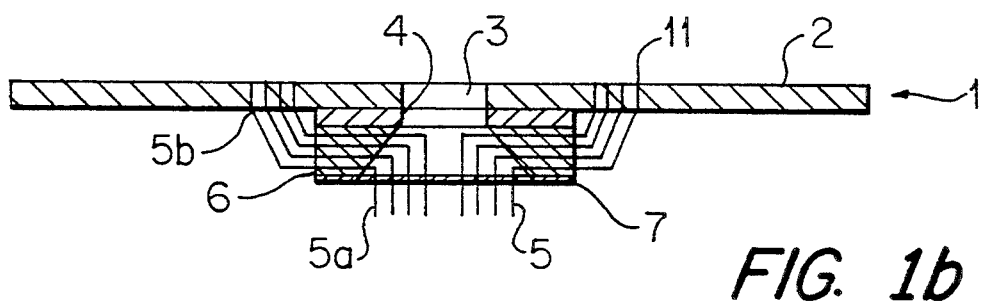
FIG. 1b is a cross sectional view of the guide-mask probe board of FIG. 1a taken along lines A–A'.
Figure 1C:
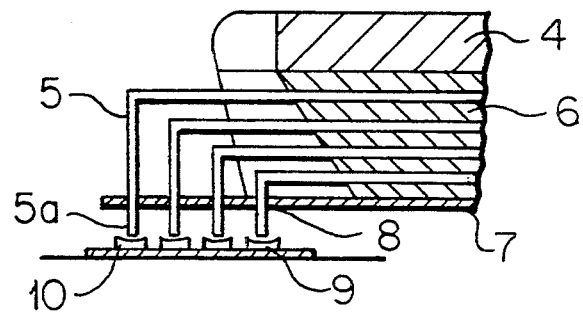
FIG. 1c is an enlarged illustration of FIG. 1b which shows probes which are raised above respective terminals.

With reference to the figures, wherein like reference characters indicate like elements throughout the several views and, in particular, with reference to FIG. 1a, 1b and 1c, a probe board 1, is illustrated.

Probe board 1 of the guide-mask system is fabricated as follows: A ring-shaped probe supporter 4 made of ceramic or aluminum is fixed to under a hole area 3 made in a center portion of a printed circuit board 2 having through-holes. Then, a molded insulator 6 is fixed to probe supporter 4 in a manner all the probe heads 5a point down out of printed circuit board 2.

A guide mask 7 made of thin film, polyester or polyamide, is fixed to a bottom side of insulator 6 in which probe 5 is fixed. Guide mask 7 has guide holes 8 set at predetermined positions where probe heads 5a pass through. As illustrated in FIG. 1c, each probe 5 is placed in close proximity to guide mask 7 so that probe heads 5a may pass through guide holes 8.

The output ends 5b of each probe 5 are soldered in respective through-holes 11 which are plated with electrically conductive materials which are disposed on printed circuit board 2. Signals are taken from the probe heads and are fed to patterned terminals on printed circuit board 2 having been allocated for terminals for ground, power supply, other components for some circuitry and for equipment of test and inspections.

By providing guide mask 7 attached to probe 5 as described above, the position of probe heads 5a may be maintained to a high degree of accuracy and the amount of head sliding movement is controlled to a minimized level even when a strong force is applied to heads 5a by the upward movement of terminals 10 of integrated circuit IC chip 9 to be tested with a help of guided power of guide-holes 8 provided on the guide mask 7.

In case an extremely small diameter hole is required, those conventional probe boards are unable to conduct the testing process because of the weak contacting pressure expected to be applied to probe 5. With the utilization of guide mask 7, however, the test may be conducted since support is reinforced by mask 7 itself. Use of mask 7 contributes to employment of smaller diameter probes and thus, higher density probe boards may be constructed.

Figure 2A:
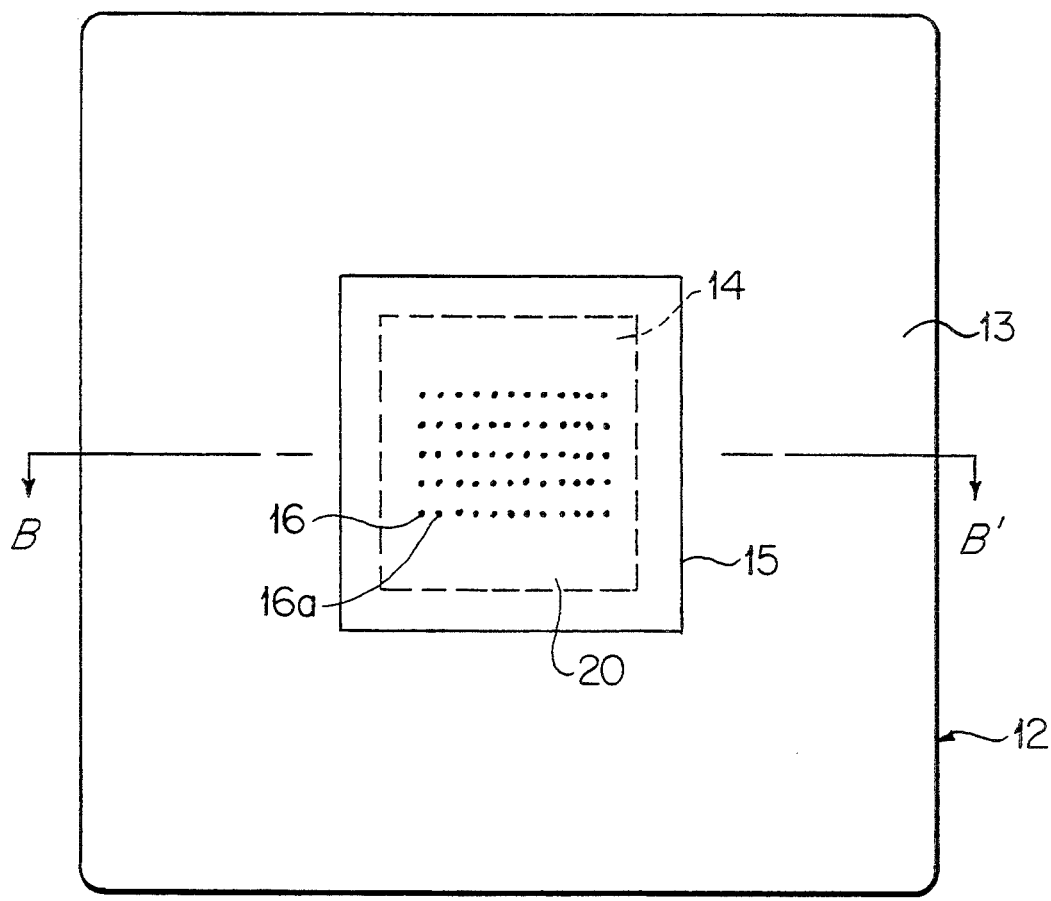
FIG. 2a is a bottom plan view of a guide-mask probe board constructed in accordance with an alternate embodiment of the invention.
Figure 2B:
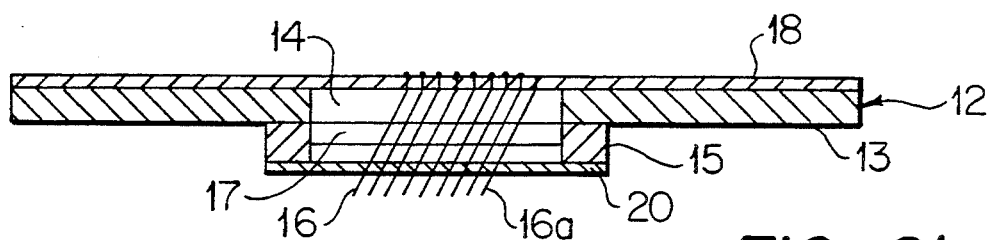
FIG. 2b is a cross sectional view of the guide-mask probe board of FIG. 2a taken along lines B–B'.
Figure 2C:
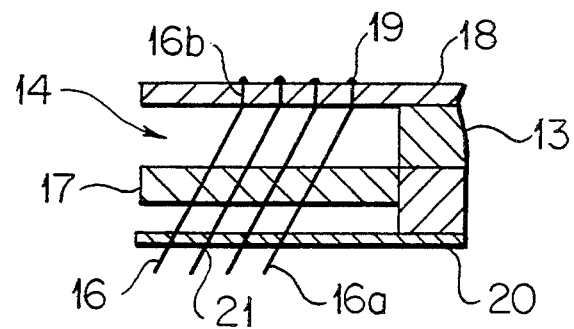
FIG. 2c is an enlarged illustration of FIG. 2b which shows probes which are raised above respective terminals.
Figure 3A:
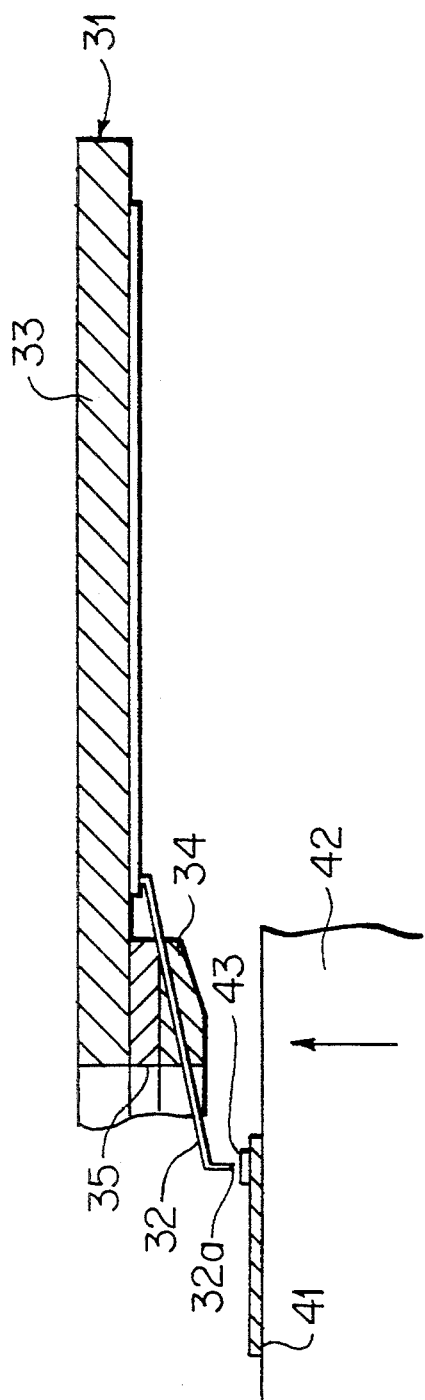
FIG. 3a is a cross sectional view of a prior art single probe board where the probe is raised above a terminal.
Figure 3B:
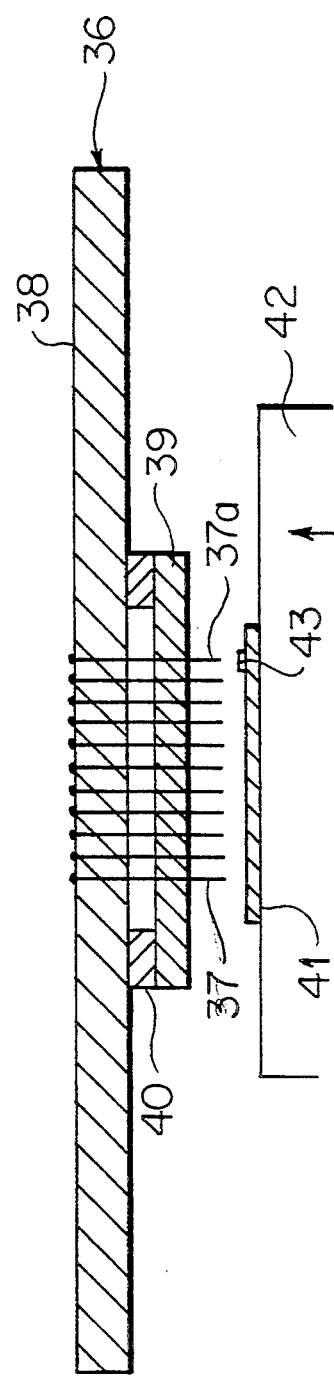
FIG. 3b is a cross sectional view of a prior art multiple probe board where the probes are raised above respective terminals.
Figure 4A:
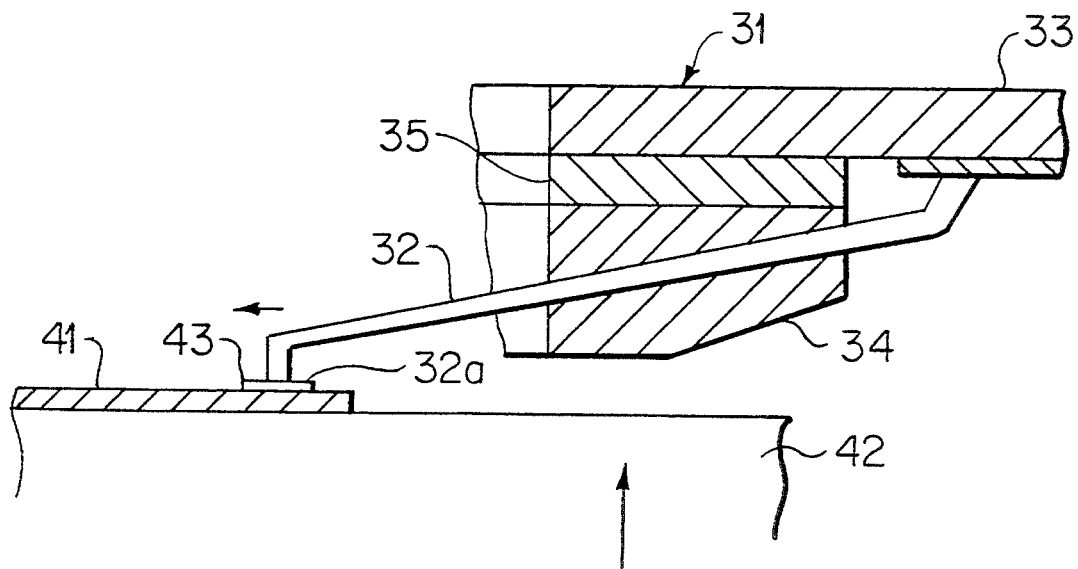
FIG. 4a is a cross sectional view of a prior art single probe board, illustrated in FIG. 3a, where the probe is in contact a terminal.
Figure 4B:
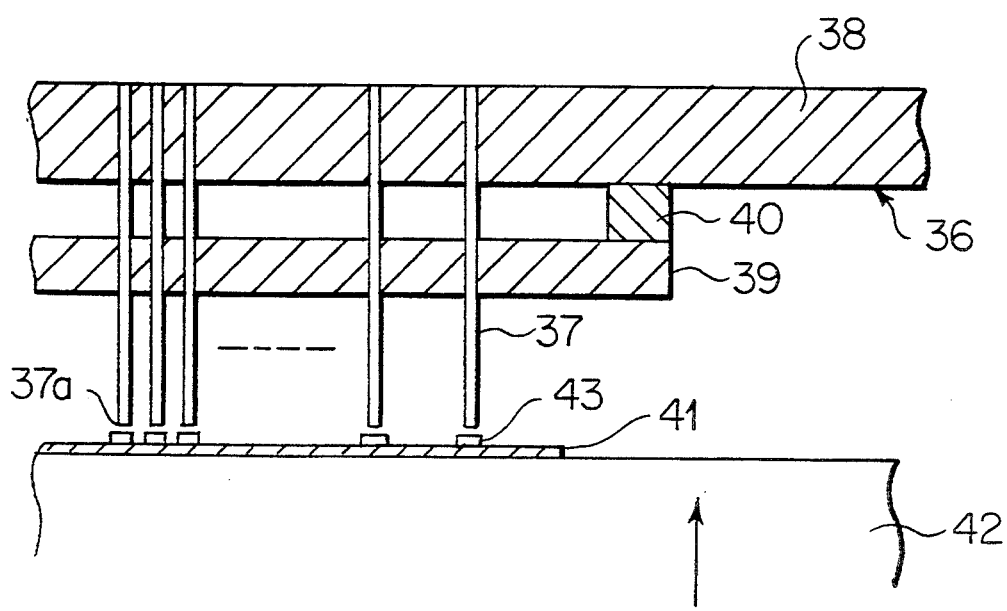
FIG. 4b is a cross sectional view of a prior art multiple probe board, illustrated in FIG. 3b, where the probes are in contact with respective terminals.

The guide-masked probe board 12 illustrated in FIG. 2 is an alternate embodiment and is constructed as described below. An opening 14 is made at a center of a base plate 13 made of materials such as aluminum oxide. Disposed about a periphery of opening 14 is a ring-shaped probe supporter 15 which is made of plastic. Then an insulator 17 is fixed to an interior surface of probe supporter 15. It should be appreciated that insulator 17 supports probes 16 which are disposed at a predetermined angle with respect to an IC chip (not shown in this view).

Probe heads 16a are arranged at the same level on probe 16. Output terminals 16b of respective probes 16 are inserted and solders into through holes 19 on printed circuit board 18 which is to be fixed to upper portion of base plate 13.

A guide mask 20 of thin film is then fixed with an adhesive agent to a bottom side of ring-shaped probe supporter 15. It should be appreciated that ring shaped supporter 15 protrudes downwardly and out from bottom side of insulator 7 disposed through guide mask 20 there are many guide holes 21 through which probe heads 16a of probe 16 may pass through. It should be appreciated that mask 20 may be used for aligning probe heads 16a with terminals, not shown in this view, which are disposed at predetermined locations. By placing guide mask 20 onto probe 16, maintenance of accurate hole locations, controlling slipping amount, and reinforcement of its heads 16a are attained as explained in conjunction with FIG. 1.

As described above, this invention has the advantage of minimizing slipping of probe heads out of respective mating test terminals of IC chips. Additionally, this invention provides accurate probe head positioning and provides enforcement to the heads by way of the filmed guide masks 7 or 20 because of the precise support holes provided in the masks 7, 20.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. An apparatus for testing and producing semiconductor chips, said apparatus comprising:
   a probe circuit board, said probe circuit board having at least one probe head;
   a means for preventing sliding and bending movement of said at least one probe head when said at least one probe head contacts a respective terminal of said semiconductor chip, said preventing means comprising a thin film guide mask in communication with said probe circuit board, said thin film guide mask having at least one alignment hole, said at least one alignment hole corresponding to said at least one probe head and said at least one probe head passing through said at least one alignment hole; and
   a ring shaped probe supporter for supporting said at least one probe head, said ring shaped probe supporter affixed to said probe circuit board.

2. The apparatus recited in claim 1 wherein said probe circuit board has a hole disposed through said probe circuit board and disposed in a central portion of said probe circuit board.

3. The apparatus recited in claim 1 wherein said ring shaped probe supporter is ceramic.

4. The apparatus recited in claim 1, wherein said ring shaped probe supporter is aluminum.

5. The apparatus recited in claim 1 wherein said probe circuit board has a hole disposed through said probe circuit board and disposed in a central portion of said probe circuit board; and
   said ring shaped probe supporter is disposed concentrically about a center of said hole and affixed to said probe circuit board.

6. The apparatus recited in claim 1 wherein said thin film guide mask is constructed of a material which is selected from the group consisting of: polyesters and polyamides.

7. The apparatus recited in claim 1, further comprising an insulator, said insulator disposed between said probe circuit board and said thin film guide mask.

8. An apparatus for testing and producing integrated circuits, said apparatus comprising:
   a probe circuit board, said probe circuit board having at least one probe head;
   a means for preventing sliding and bending movement of said at least one probe head when said at least one probe head contacts a respective terminal of said integrated circuit, said preventing means comprising a thin film guide mask in communication with said probe circuit board, said thin film guide mask having at least one alignment hole, said at least one alignment hole corresponding to said at least one probe head and said at least one probe head passing through said at least one alignment hole; and a ring shaped probe supporter for supporting said at least one probe head, said ring shaped probe supporter affixed to said probe circuit board.

9. The apparatus recited in claim 8 wherein said ring shaped probe supporter is ceramic.

10. The apparatus recited in claim 8 wherein said ring shaped probe supporter is aluminum.

11. The apparatus recited in claim 8 wherein said probe circuit board has a hole disposed through said probe circuit board and disposed in a central portion of said probe circuit board; and said ring shaped probe supporter is disposed concentrically about a center of said hole and affixed to said probe circuit board.

12. The apparatus recited in claim 11 wherein said insulator is disposed along an inner periphery of said ring shaped probe supporter.

13. The apparatus recited in claim 11 wherein said insulator is affixed to a lower surface of said ring shaped probe supporter.

14. The apparatus recited in claim 8 wherein said thin film guide mask constructed of a material which is selected from the group consisting of: polyesters and polyamides.

* * * * *